US012694920B2

(12) United States Patent
Kim

(10) Patent No.: US 12,694,920 B2
(45) Date of Patent: Jul. 28, 2026

(54) MEMORY DEVICES, MEMORY SYSTEMS HAVING THE SAME AND OPERATING METHODS THEREOF

(71) Applicant: Samsung Electronics Co., Ltd., Suwon-si (KR)

(72) Inventor: Taewon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 494 days.

(21) Appl. No.: 18/135,822

(22) Filed: Apr. 18, 2023

(65) Prior Publication Data

US 2024/0112719 A1 Apr. 4, 2024

(30) Foreign Application Priority Data

Sep. 30, 2022 (KR) ......................... 10-2022-0124934

(51) Int. Cl.
*G11C 11/406* (2006.01)
*G11C 11/4078* (2006.01)

(52) U.S. Cl.
CPC ... *G11C 11/40611* (2013.01); *G11C 11/40603* (2013.01); *G11C 11/40615* (2013.01); *G11C 11/40622* (2013.01); *G11C 11/4078* (2013.01)

(58) Field of Classification Search
CPC ........ G11C 11/40622; G11C 11/40603; G11C 11/40615; G11C 11/4078; G11C 16/24; G11C 16/26; G11C 11/40611; G11C 11/408; G06F 3/0658
See application file for complete search history.

(56) References Cited

U.S. PATENT DOCUMENTS

| | | | |
|---|---|---|---|
| 9,318,185 B2 | 4/2016 | Kim et al. | |
| 9,431,085 B2 | 8/2016 | Greenberg et al. | |
| 9,589,606 B2 | 3/2017 | Lin et al. | |
| 9,767,883 B2 | 9/2017 | Doo et al. | |
| 9,892,779 B2 | 2/2018 | Kang et al. | |
| 9,972,377 B2 | 5/2018 | Oh et al. | |
| 9,978,440 B2 | 5/2018 | Cho | |
| 10,090,039 B2 | 10/2018 | Doo et al. | |
| 10,223,311 B2 | 3/2019 | Doo et al. | |

(Continued)

FOREIGN PATENT DOCUMENTS

EP 2926344 B1 10/2019

*Primary Examiner* — Jay W. Radke

(74) *Attorney, Agent, or Firm* — Wolf, Greenfield & Sacks, P.C.

(57) ABSTRACT

A memory device includes first registers configured to store row addresses second registers configured to store an access count of each of the row addresses and generate a reference value flag signal when the access count is higher than a reference value. The memory device also includes a target row refresh controller configured to select one of the row addresses as a first target row address in response to the reference value flag signal, perform a first refresh operation on at least one first row address adjacent to the first target row address, randomly select one of the row addresses as a second target row address, and perform a second refresh operation on at least one second address adjacent to the second target row address. The second refresh operation may be performed when the reference value flag signal indicates that the access count is not greater than the reference value.

20 Claims, 13 Drawing Sheets

(56)     References Cited

U.S. PATENT DOCUMENTS

| | | |
|---|---|---|
| 10,446,216 B2 | 10/2019 | Oh et al. |
| 10,600,470 B2 | 3/2020 | Bang |
| 10,607,683 B2 | 3/2020 | Shin et al. |
| 10,719,467 B2 | 7/2020 | Doo et al. |
| 10,811,077 B2 | 10/2020 | Shin et al. |
| 10,860,222 B2 | 12/2020 | Shin et al. |
| 10,908,846 B2 | 2/2021 | Lee et al. |
| 11,037,617 B2 | 6/2021 | Gans |
| 11,087,821 B2 | 8/2021 | Son et al. |
| 11,197,531 B2 | 12/2021 | Hogan |
| 11,222,685 B2 | 1/2022 | Brandl et al. |
| 2020/0294576 A1 | 9/2020 | Brown et al. |
| 2021/0407583 A1 | 12/2021 | Penney et al. |
| 2022/0084564 A1* | 3/2022 | Choi ................... G11C 11/4087 |
| 2022/0189532 A1 | 6/2022 | Nale et al. |
| 2023/0143468 A1* | 5/2023 | Hong ................. G11C 11/4087 |
| | | 365/222 |
| 2023/0154522 A1* | 5/2023 | Kim ...................... G06F 7/5443 |
| | | 365/222 |

* cited by examiner

MEMORY DEVICES, MEMORY SYSTEMS HAVING THE SAME AND OPERATING METHODS THEREOF

CROSS-REFERENCE TO RELATED APPLICATION

This application claims benefit of priority to Korean Patent Application No. 10-2022-0124934 filed on Sep. 30, 2022, in the Korean Intellectual Property Office, and the entire contents of the above-identified application are incorporated by reference herein.

BACKGROUND

The present inventive concept relates to a memory devices, memory systems including the same, and an operating methods thereof.

In general, dynamic random access memory (DRAM) performs a refresh operation to maintain stored data. That is, DRAM may maintain data stored in a cell capacitor through a refresh operation. With the development of process technology, such as an increase in the degree of integration, a gap between DRAM cells has increasingly narrowed. In addition, due to the reduction of the inter-cell gap, interference caused by adjacent cells or word lines has been identified as an increasingly important data reliability factor. Even if the aforementioned interference is concentrated on a specific cell, it may be difficult to restrict access to a specific address in a random access memory, such as DRAM. Accordingly, a disturbance may occur in the specific cell, which may also affect refresh characteristics of the cell.

SUMMARY

Aspects of the present inventive concepts provide memory devices that are configured to reduce an occurrence of row hammer disturbance, memory systems including the same, and operating methods thereof.

According to some aspects of the present inventive concepts, a memory device may include: first registers configured to store row addresses; second registers each configured to store an access count of a corresponding one of the row addresses stored in the first registers and to generate (activate) a reference value flag signal when an access count of the second registers is higher than a reference value; and a target row refresh controller selecting one of the row addresses as a first target row address in response to a reference value flag signal, perform a first refresh operation on at least one first row address adjacent to the first target row address, randomly select one of the row addresses as a second target row address, and perform a second refresh operation on at least one second row address adjacent to the second target row address. The target row refresh controller may be configured to perform the second refresh operation when the reference value flag signal indicates that the access count corresponding to the first target row address is not greater than the reference value.

According to some aspects of the present inventive concepts, a memory system may include: a memory device; and a controller controlling the memory device, wherein the memory device includes: a memory cell array including a plurality of banks having memory cells connected to a plurality of word lines and a plurality of bit lines; and a target row refresh circuit configured to manage a row hammer attack of the memory cell array to be below a reference value.

According to some aspects of the present inventive concepts, an operating method of a memory device includes: receiving a row address from an external device; updating an access count when the row address is one of a plurality of previously stored target row addresses; determining whether the updated access count is higher than a reference value; selecting a target row address corresponding to an access count having a largest value among access counts of the target row addresses when the updated access count is greater than the reference value; and performing a refresh operation on at least one row address adjacent to the target row address.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

In general, a selected word line voltage may be provided to a selected word line in a read operation or a write operation. In this case, a voltage of adjacent word lines may increase due to a capacitive coupling effect, even though the selected word line voltage is not applied to the adjacent word lines. When repetitive access is performed on the selected word line, charges may leak from memory cells corresponding to the adjacent word lines. There is the potential to use this repetitive access in a disruptive manner. This phenomenon, when used disruptively to alter contents of an adjacent word line, may be referred to as row hammer, or as a row hammer attack. Technology for detecting and refreshing the row hammer has been applied for by Samsung Electronics and is described in U.S. Pat. Nos. 9,589,606, 9,767,883, 9,892,779, 9,972,377, 9,978,440, 10,090,039, 10,223,311, 10,719,467, 10,446,216, 10,600,470, 10,607,683, 10,811, 077, 10,860,222, 11,087,821, and 11,197,531.

In general, row hammer attack patterns are not standardized. As row hammer attacks have become more diverse, proper care methods are required according to attack patterns without fixing care methods. It may be necessary or desired to perform intensive care for a row address that is intensively attacked, and to perform random care for a row address that is received as an event. A memory device, a memory system having the same, and an operating method thereof according to an embodiment of the present inventive concept may manage row hammer levels so as to be less than or equal to a predetermined threshold for various row hammer attack patterns. For example, when a count value of a row address register exceeds a reference value, the memory device may search for and care for a row address having a maximum count value inside the register. Meanwhile, when the count value of the row address does not exceed the reference value, the memory device may randomly care for the row address. Accordingly, the memory device may effectively manage the row hammer for various attack patterns.

Figure 1:
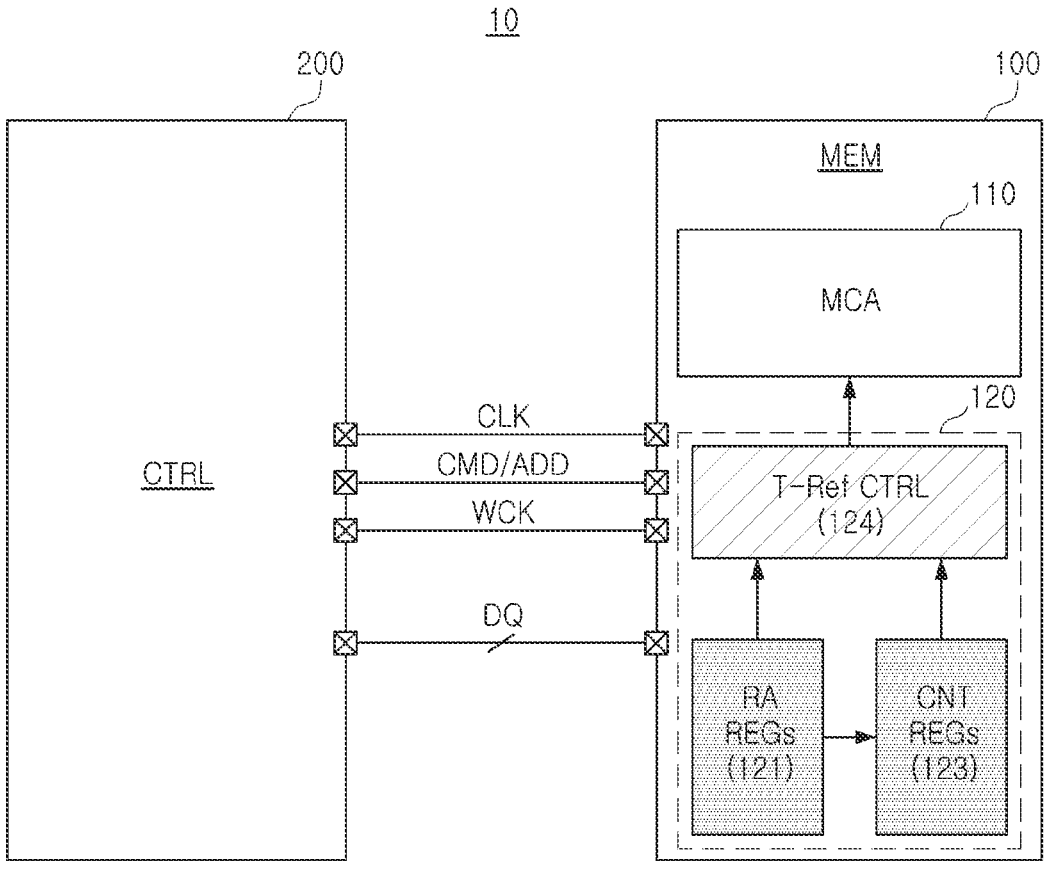
FIG. 1 is a diagram illustrating a memory system according to some example embodiments of the present inventive concepts.

FIG. 1 is a diagram illustrating a memory system 10 according to some example embodiments of the present inventive concepts. Referring to FIG. 1, a memory system 10 may include a memory device (MEM) 100 and a memory controller (CTRL) 200 that controls or is configured to control the memory device 100.

The memory system 10 may be implemented to be included in a personal computer or mobile electronic device. Mobile electronic devices may be implemented as laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PNDs), handheld game consoles, mobile Internet devices (MIDs), wearable computers, Internet of things (IoT) devices, Internet of everything (IoE) devices, or drones, as non-limiting examples.

The memory device 100 may be implemented to store data. In some embodiments, the memory device 100 may be implemented as a volatile memory device. As non-limiting examples, the volatile memory device may be implemented as a random access memory (RAM), a dynamic RAM (DRAM), a static RAM (SRAM), or a low power double data rate (LPDDR) DRAM. In some embodiments, the memory device 100 may be implemented as a non-volatile memory device. For example, non-volatile memory devices include electrically erasable programmable read-only memory (EEPROM), flash memory, phase change random access memory (PRAM), resistive random access memory (RRAM), nano floating gate memory (NFGM), polymer random access memory (PoRAM), magnetic random access memory (MRAM), or ferroelectric random access memory (FRAM).

Referring back to FIG. 1, the memory device 100 may include a memory cell array (MCA) 110 and a target row refresh circuit 120.

The memory cell array MCA 110 may include a plurality of memory banks. Each of the plurality of memory banks may include a plurality of memory cells connected to word lines and bit lines.

The target row refresh circuit 120 may include row address registers 121 (RA REGs), count registers (CNT REGs) 123, and a target row refresh controller (T-Ref CTRL) 124.

Each of the row address registers (first registers) 121 may be implemented to store a row address requiring intensive care. Each of the count registers (second registers) 123 may be implemented to store an access count of a row address stored in each of the row address registers 121. Also, each of the count registers 123 may be implemented to reset a count value after performing a refresh operation of a corresponding row address.

The target row refresh controller 124 may be implemented (e.g., configured) to perform a refresh operation on a target row according to a request from an external device (e.g., CTRL 200) or an internal request. In some embodiments, when a count value exceeding a reference value exists among the count values stored in the count registers 123, the target row refresh controller 124 may perform a refresh operation on a target row address corresponding to a corresponding row address. In some embodiments, when there is no count value that exceeds the reference value among the count values stored in the count registers 123, the target row refresh controller 124, when receiving an active command ACT, may randomly select one of row addresses and perform a refresh operation on a target row address corresponding to the selected row address. In some embodiments, the random row address may be generated by a random row address generator. The row addresses generated by the random row generator may be stored in registers. Here, the random row generator may generate a row address using a random number generated by the random number generator. In some embodiments, random numbers may be stored in a look-up table.

As described above, the memory device 100 may select a target row in response to a command from the memory controller 200 or by itself using the row address registers 121 and the count registers 123, and perform a refresh operation on the selected row.

The memory controller 200 may be implemented to control the memory device 100 to read data stored in the memory device 100 and/or write data to the memory device 100. The memory controller 200 may control a write operation or a read operation of the memory device 100 by providing a command CMD and an address ADDR to the memory device 100 in synchronization with a clock CLK. Also, data may be input to and/or output from the memory device 100 through data lines DQ, and the data may be transmitted and/or received between the memory controller 200 and the memory device 100 in synchronization with a data transfer clock WCK.

Also, the memory controller 200 may provide interfacing (e.g., may provide an interface) between a host and the memory device 100. The memory controller 200 may exchange data and signals with the memory device 100 through control signal lines /RAS, /CAS, and /WE, address lines ADD, data lines DQ, and warning signal lines.

A typical memory system may count the number of active ACT signals of a row for a certain period of time (e.g., tREFI (refresh interval)), and may perform an additional refresh operation on rows (or victim rows) adjacent to a row storing the highest count. However, these memory devices cannot effectively respond to various row hammer attack patterns.

Meanwhile, the memory system 10 including the memory device 100 managing the row hammer below the reference value according to embodiments of the present disclosure may protect more effectively against various row hammer attacks.

Figure 2A:
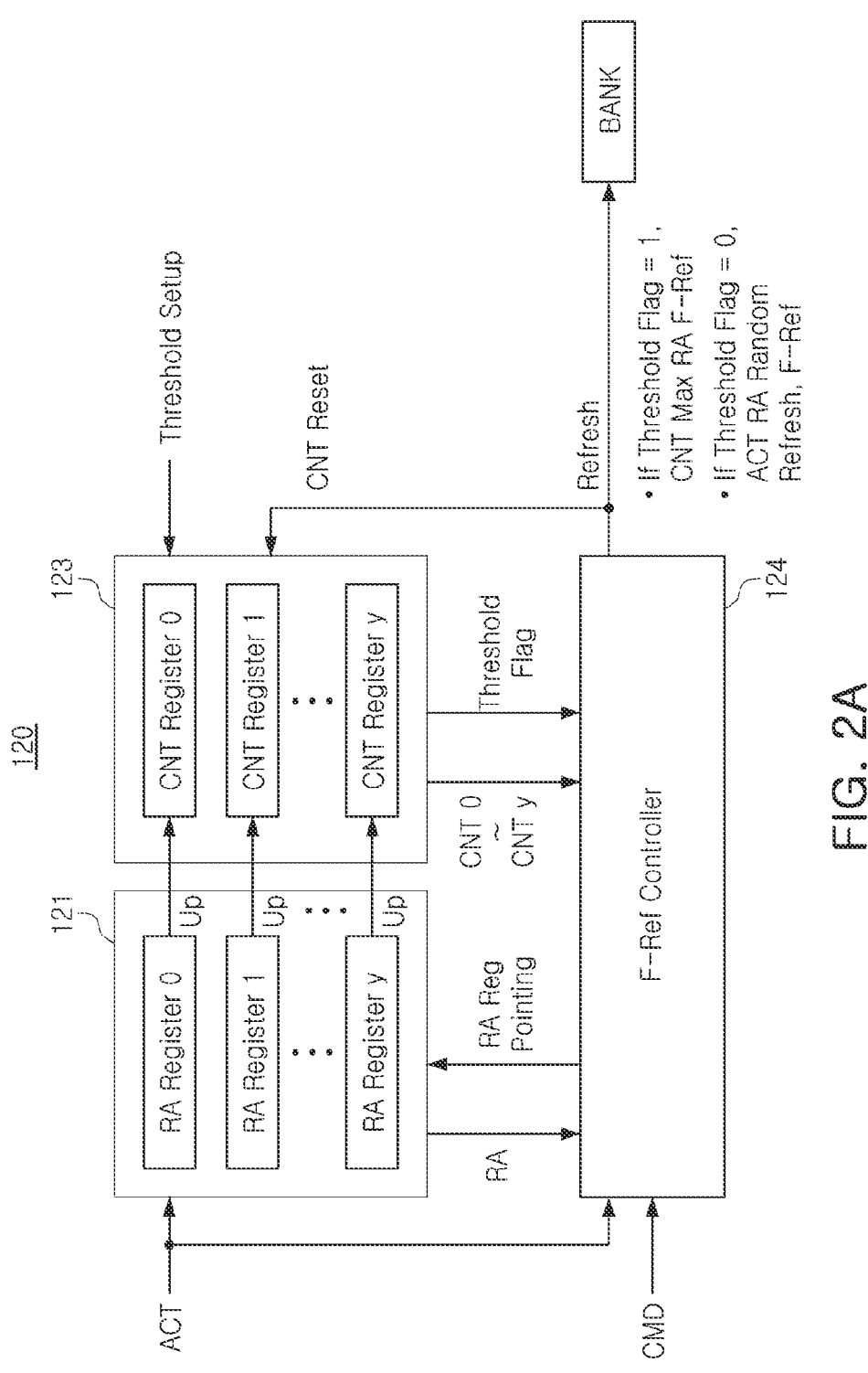
FIG. 2A is a diagram illustrating a target row refresh circuit according to some example embodiments of the present inventive concepts.

FIG. 2A is a diagram illustrating the target row refresh circuit 120 according to some example embodiments of the present inventive concepts. Referring to FIG. 2A, the target row refresh circuit 120 may include row address (RA) registers 121, count (CNT) registers 123, and a target row refresh (F-Ref) controller 124.

The row address registers 121 (first registers) may include a plurality of registers storing or configured to store target row addresses. The stored row address may be output according to a row address register pointing of the target row refresh controller 124.

The count registers 123 (second registers) may include a plurality of registers increasing or configured to increase a corresponding count value when a received row address is the same as an address stored in the row address registers 121 and storing or configured to store the increased count value in response to the active command ACT.

In addition, each of the count registers 123 may be implemented (e.g., configured) to determine whether the count value is higher than a reference value (or a threshold value) and to output a threshold value flag signal according to a determination result. Here, the reference value may be set according to an internal policy of the memory device 100 (refer to FIG. 1) or a selection of the controller 200 (refer to FIG. 1).

The target row refresh controller 124 may be implemented (e.g., configured) to receive the active command ACT and the command CMD, select a target row address, and perform a refresh operation corresponding to the target row address.

When the count value exceeds the reference value, the target row refresh controller 124 may select an address adjacent to the corresponding row address as a target row address and perform a first refresh operation corresponding to the selected target row address. The first refresh operation may be a count-based refresh operation. To this end, the target row refresh controller 124 may receive a reference value flag and a plurality of count values from the count registers 123. Here, the reference value flag may be a value indicating whether the count value exceeds the reference value. For example, when the reference value flag is '1', at least one of the values stored in the count registers 123 exceeds the reference value. Meanwhile, when the reference value flag is '0', all values stored in the count registers 123 do not exceed the reference value.

In addition, when the count value does not exceed the reference value, the target row refresh controller 124 may randomly select one of the row addresses received by the active command ACT, then select an address adjacent to the selected row address as a target row address, and perform a second refresh operation corresponding to the selected target row address. The second refresh operation may be a random pick-based refresh operation. Here, the random pick may use a random number generated by a random number generator.

Also, after performing a refresh operation corresponding to the target row address, the target row refresh controller 124 may reset the count value corresponding to the target row address.

Figure 2B:
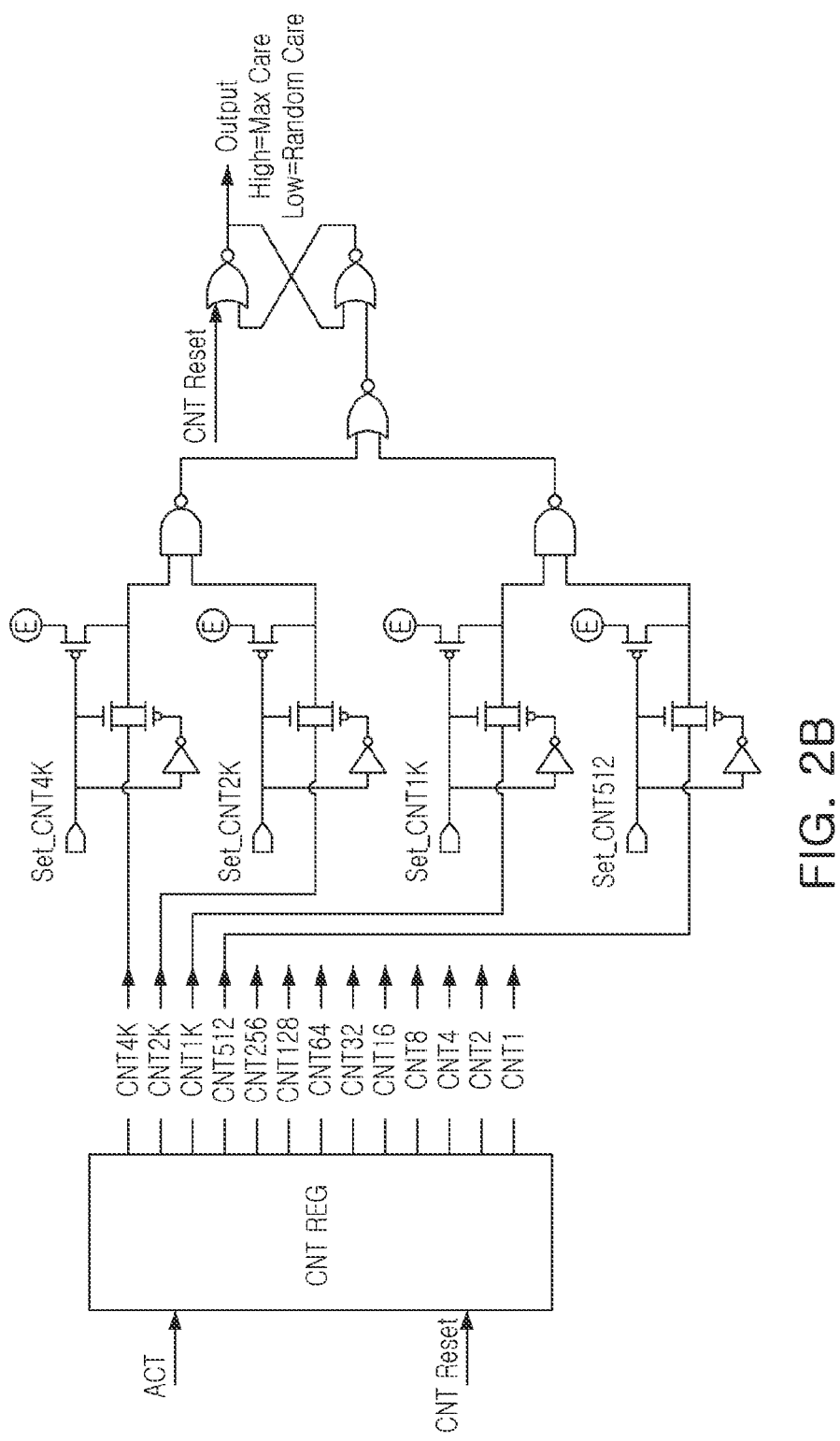
FIG. 2B is a diagram illustrating reference value setting according to some example embodiments of the present inventive concepts.

FIG. 2B is a diagram illustrating reference value setting according to some embodiments of the present inventive concept. All counter registers may perform ORING on an output by setting the same reference value as follows.

In some embodiments, when the output has a high level, a Max Care refresh operation may be performed. In an embodiment, when the output has a low level, a Random Care refresh operation may be performed. If a row address (RA) of the corresponding register is taken care of, CNT Reset (count reset) is performed.

Reference values (0.5K, 1K, 1.5K, 2K, 2.5K, 3K, 4K, 4.5K, 5K, 5.5K, 6K, 6.5K, 7K, 7.5K settings) may be set for 4K, 2K, 1K, and 512 with four test mode register sets (TMRSs) illustrated in FIG. 2B. In some embodiments, when Set_CNT4K and Set_CNT2K have a high level, 6K may be a reference value. When more than 6K, Max Care refresh operation may be performed. Meanwhile, a Random Care refresh operation may be performed when not more than 6K.

Figure 3:
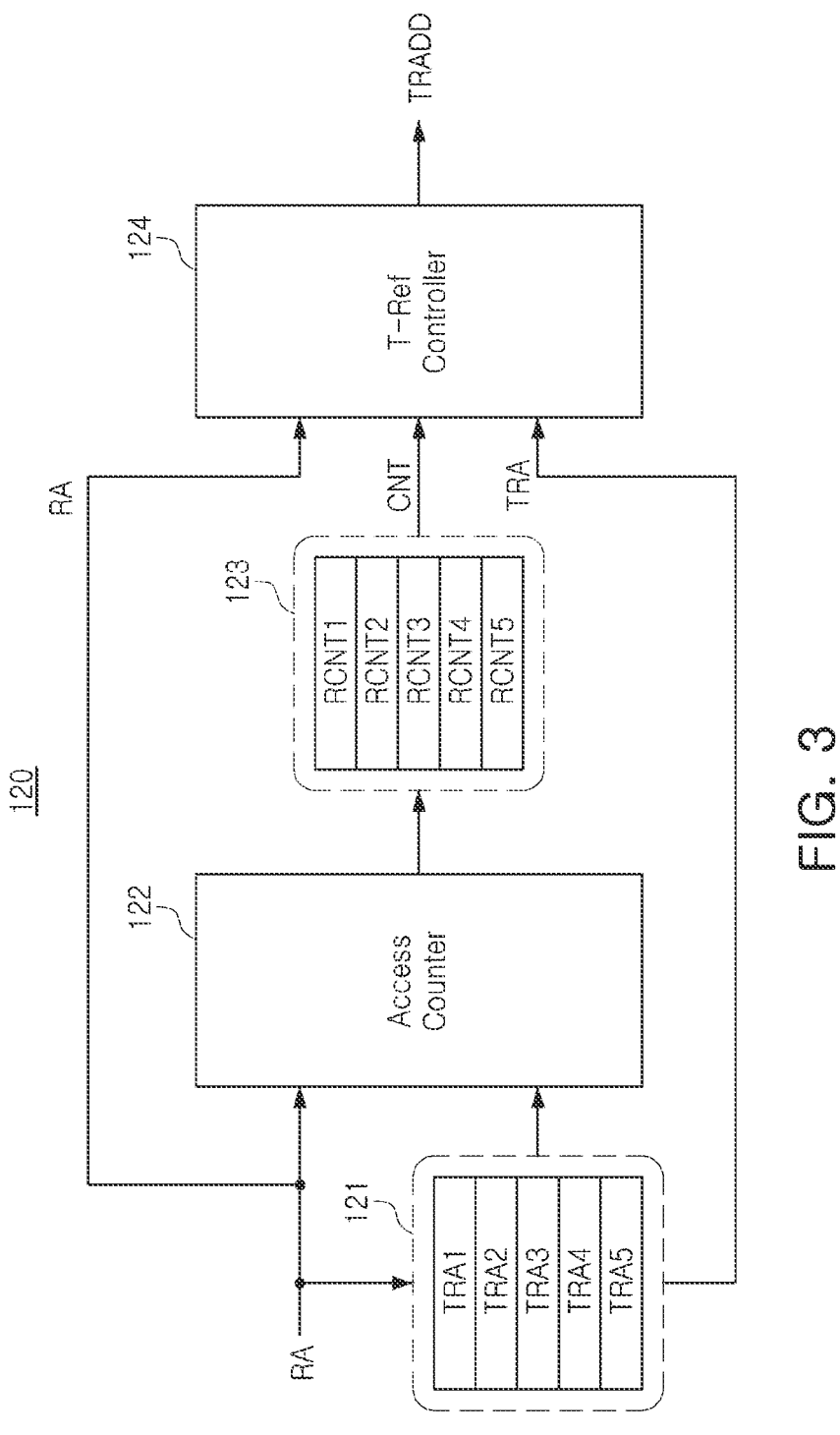
FIG. 3 is a diagram illustrating a target row address generating process of a target row refresh circuit according to some example embodiments of the present inventive concepts.

FIG. 3 is a diagram illustrating a process of generating a target row address of the target row refresh circuit 120 according to some embodiments of the present inventive concepts. The first registers 121 may be implemented to store a plurality of target row addresses TRA1 to TRA5. Here, for convenience of description, the number of target row addresses is 5, but it should be understood that the present inventive concepts are not limited thereto. The second registers 123 may be implemented to store access count values RCNT1 to RCNT5 for each of a plurality of target row addresses.

The access counter 122 may be implemented (e.g., configured) to receive a row address RA according to an input/output request and count up a count value for a corresponding target row address. The count values that have been counted up may be stored in the second registers 123. Meanwhile, after the refresh operation of one of the target row addresses TRA1 to TRA5 is completed, a count value of a register corresponding to one of the target row addresses may be reset.

The target row refresh controller 124 may select a target refresh address TRADD to perform refresh using the first registers 121 or the second registers 123. For example, when the count value exceeds the reference value, the target row refresh controller 124 may determine a row address adjacent to a target row address having the largest value, among the access count values RCNT1 to RCNT5, at a predetermined time, as a target refresh address (TRADD). In addition, when the count value does not exceed the reference value, the target row refresh controller 124 may determine a row address adjacent to the target row address selected by random pick at a predetermined time point, as the target refresh address TRADD.

Figure 4A:
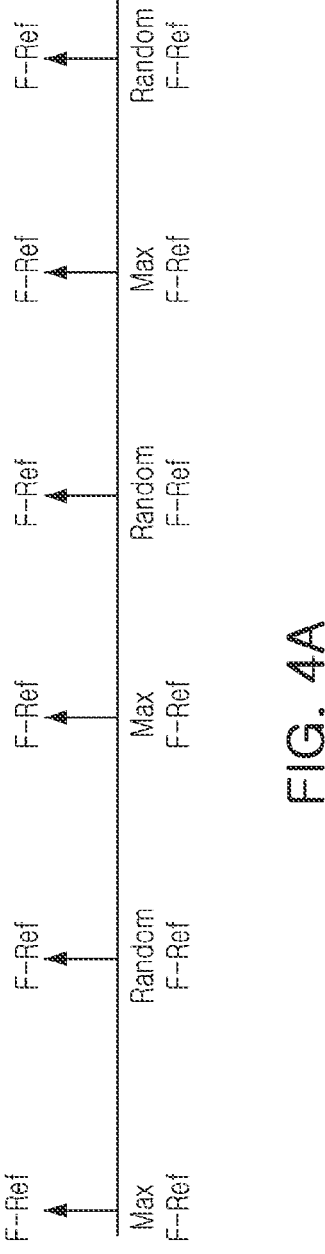
FIG. 4A is a diagram illustrating row hammer care of a general target row refresh circuit.

FIG. 4A is a diagram illustrating row hammer care of a general target row refresh circuit. Referring to FIG. 4A, a target refresh operation may be performed by fixing the ratio of a maximum count value refresh operation and a random pick refresh operation. For example, the target refresh operation may be performed at a ratio of 1:1 or 1:7, which may be a ratio between the maximum count refresh operation and the random pick refresh operation.

Figure 4B:
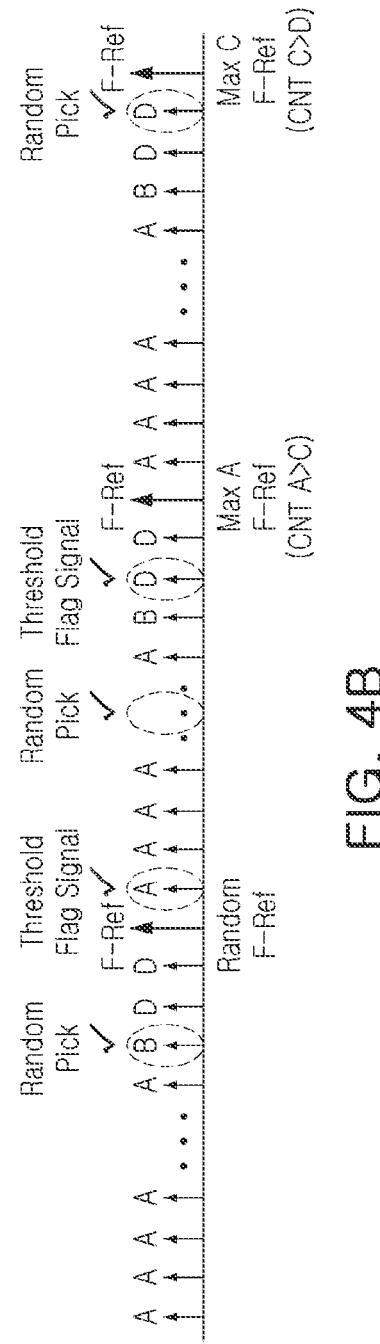
FIG. 4B is a diagram illustrating row hammer care of a target row refresh logic of the present inventive concepts.

FIG. 4B is a diagram illustrating row hammer care of the target row refresh circuit 120 of the present inventive concept. Referring to FIG. 4B, the target row refresh circuit 120 may count activated row addresses ACT RA using a space saving algorithm, and when a count value exceeds a specific reference value (threshold), the target row refresh circuit 120 may generate a reference value flag. For example, when the reference value flag has a high level, the target row refresh circuit 120 may perform a count max value refresh operation Count Max RA F-Ref. Also, when the reference value flag has a low level, the target row refresh circuit 120 may perform a random pick refresh operation.

As described above, the target row refresh circuit 120 of the present inventive concept may manage row hammers to be less than or equal to a specific reference value for various attack patterns.

Figure 5:
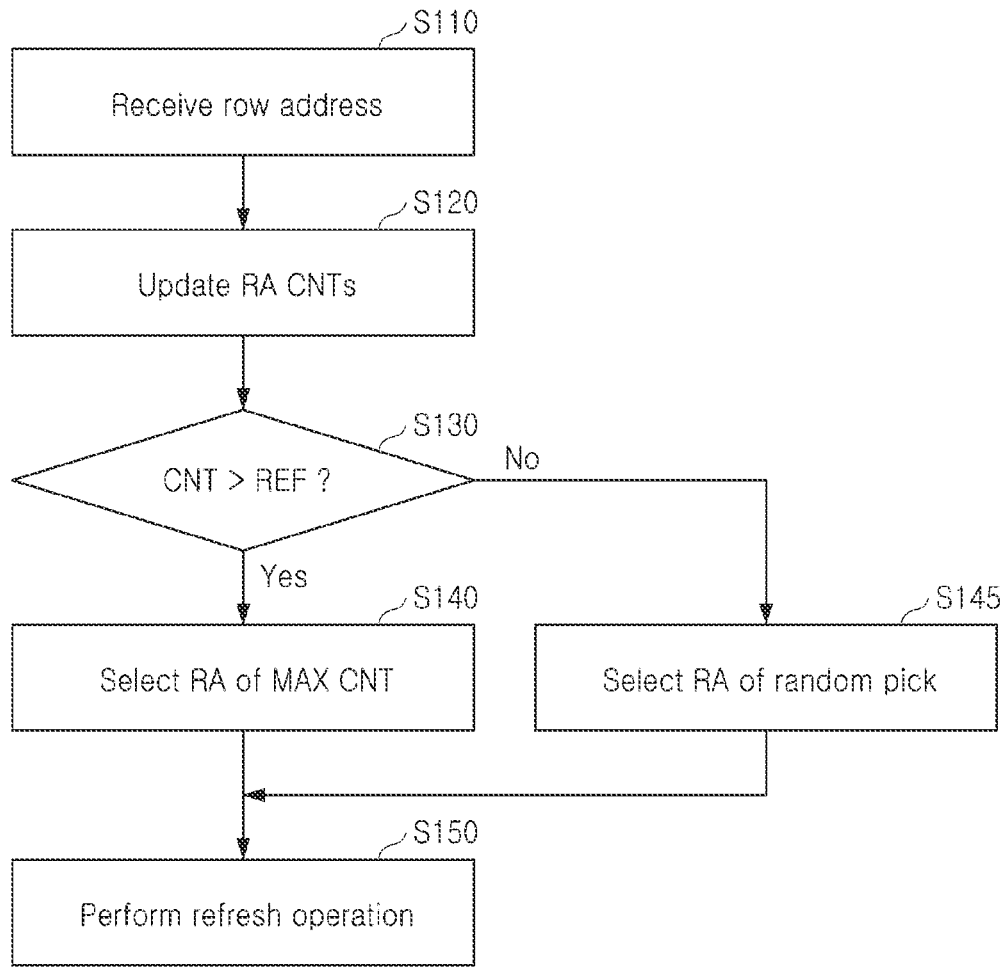
FIG. 5 is a flowchart illustrating an operating method of a memory device according to some example embodiments of the present inventive concepts.

FIG. 5 is a flowchart illustrating an operating method of a memory device according to an example embodiment of the present inventive concept. Referring to FIGS. 1 to 5, a refresh operation of the memory device 100 may be performed as follows.

The memory device 100 may receive a row address related to a read operation or a write operation (S110). The memory device 100 may determine whether the received row address is a target row address, and update a count value if the row address is a target row address (S120). The memory device 100 may determine whether the count value exceeds a reference value and may generate a reference value flag signal corresponding to whether the count value exceeds the reference value (S130).

If the count value exceeds the reference value (Yes from S130), the memory device 100 may select a row address corresponding to a count value having a maximum value as a target refresh address (S140). Meanwhile, when the count value does not exceed the reference value (No from S130), the memory device 100 may select a corresponding row address as a target refresh address using a random pick (S145). Thereafter, the memory device 100 may perform a refresh operation on at least one row address adjacent to the selected target refresh address (S150).

Figure 6:
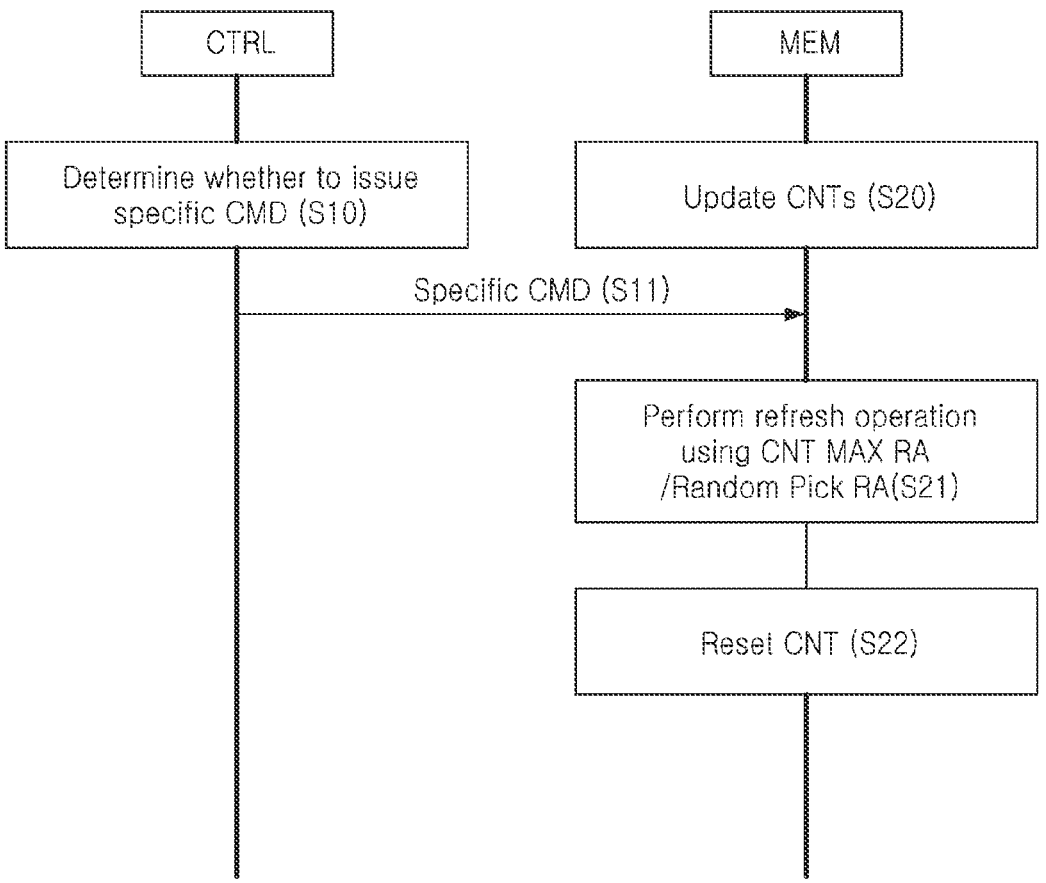
FIG. 6 is a ladder diagram illustrating a refresh operation of a memory system according to some example embodiments of the present inventive concepts.

FIG. 6 is a ladder diagram illustrating a refresh operation of the memory system 10 according to some example embodiments of the present inventive concepts. Referring to FIG. 6, the memory controller CTRL may issue a special command for performing a row hammer-related refresh operation and transmit the issued special command to the memory device MEM (S10). Here, the RFM command may be issued according to an internal policy of the memory controller CTRL.

The memory device MEM may update access count values for a plurality of target row addresses (S20). The memory device MEM may receive the special command, select a target refresh address in response to the received special command, and perform a refresh operation on the selected target row (S21). Here, the target refresh address may be selected by any one of a count maximum row address CNT MAX RA and a random pick row address Random Pick RA according to the reference value flag signal. Here, the reference value flag signal may be a signal indicating whether the count value exceeds the reference value. Thereafter, the memory device MEM may reset the count value for the target row address on which the refresh operation has been performed (S22).

Figure 7:
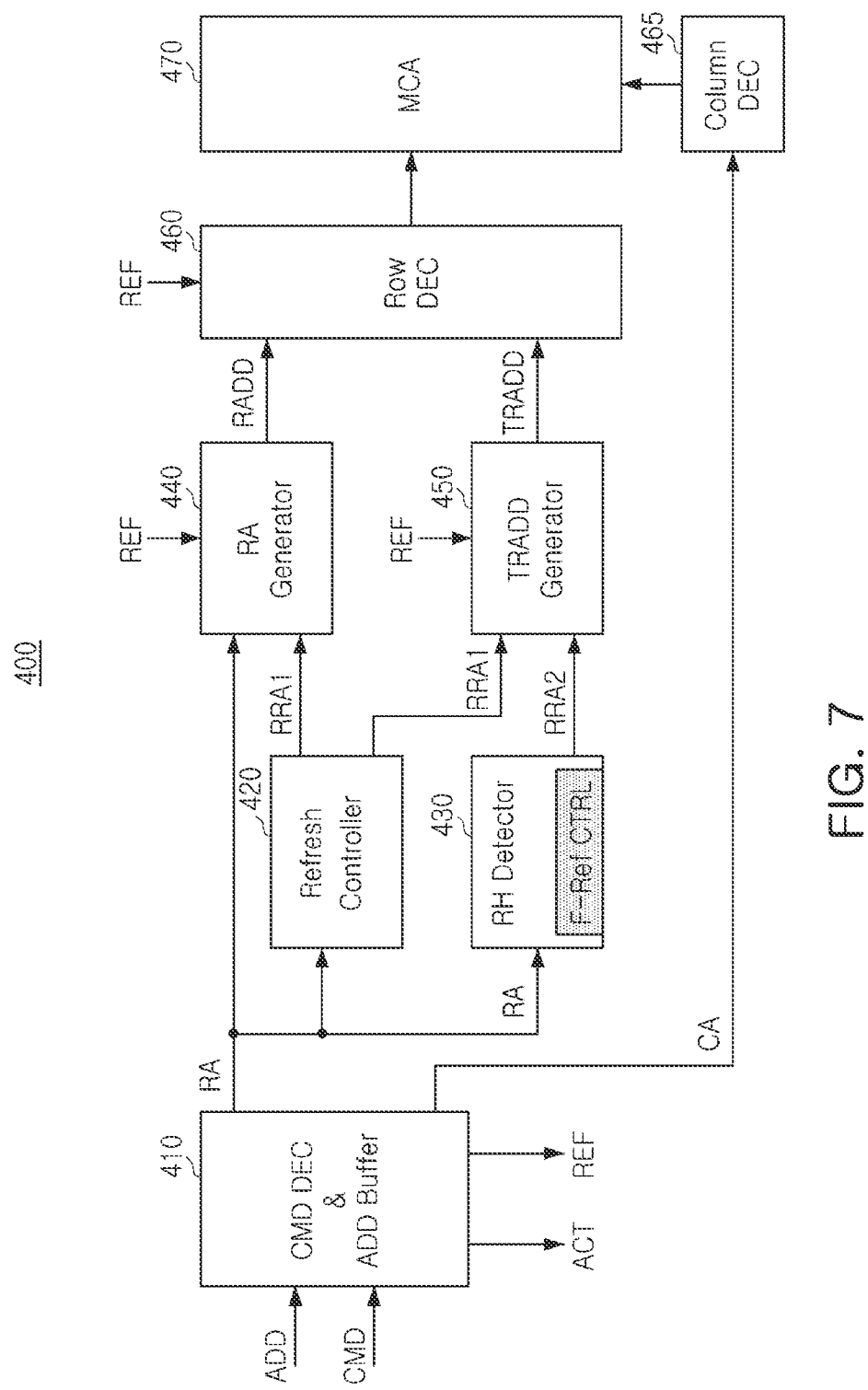
FIG. 7 is a diagram illustrating a memory device according to some example embodiments of the present inventive concepts.

FIG. 7 is a diagram illustrating a memory device according to some example embodiments of the present inventive concepts. Referring to FIG. 7, a memory device 400 may include a command decoder and address buffer 410, a refresh controller 420, a row hammer detector 430, a row address generator 440, a target row address generator 450, a row decoder 460, a column decoder 465, and a memory cell array 470.

The command decoder and address buffer 410 may decode a command CMD to generate an active command ACT, a refresh command REF, a read command, or a write command. Also, the command decoder and address buffer 410 may receive an address ADD and output a row address RA and a column address CA. The row address RA may be input together with the active command ACT, and the column address CA may be input together with a read command or a write command. The refresh command REF may be a self-refresh command or an auto refresh command. Here, when the refresh command REF is a self-refresh command, the refresh command REF may be internally generated. Also, when the refresh command REF is an auto refresh command, the refresh command REF may be provided from an external controller CTRL (refer to FIG. 1).

The refresh controller 420 may generate a first refresh row address RRA1 in response to the refresh command REF. Here, the first refresh row address RRA1 may be used to select a plurality of word lines of the memory cell array MCA 470 or a plurality of blocks of the memory cell array 470.

The row hammer detector 430 may receive the row address RA in response to the active command ACT and may generate a second refresh row address RRA2. As described in FIGS. 1 to 6, the row hammer detector 430 may include the target row refresh controller F-REF CTRL to manage row hammers to be below a reference value.

The row address generator 440 may be implemented to select the row address RA in response to the active command ACT and select the first refresh row address RRA1 in response to the refresh command REF to generate row address signals RADD.

The target row address generator 450 may be implemented to output one of the first refresh row address RRA1 and the second refresh row address RRA as the target row address signal TRADD in response to the refresh command REF.

The row decoder 460 may be implemented to decode the row address signal RADD to generate word line signals in response to the active command ACT or to decode at least one of the row address signal RADD and target row address signal TRADD to generate word line signals in response to the refresh command REF. Word lines of the memory cell array 470 may be activated by the generated word line signals.

Meanwhile, the memory device according to some embodiments of the present inventive concepts may include a row hammer protection circuit implemented as a separate chip.

Figure 8:
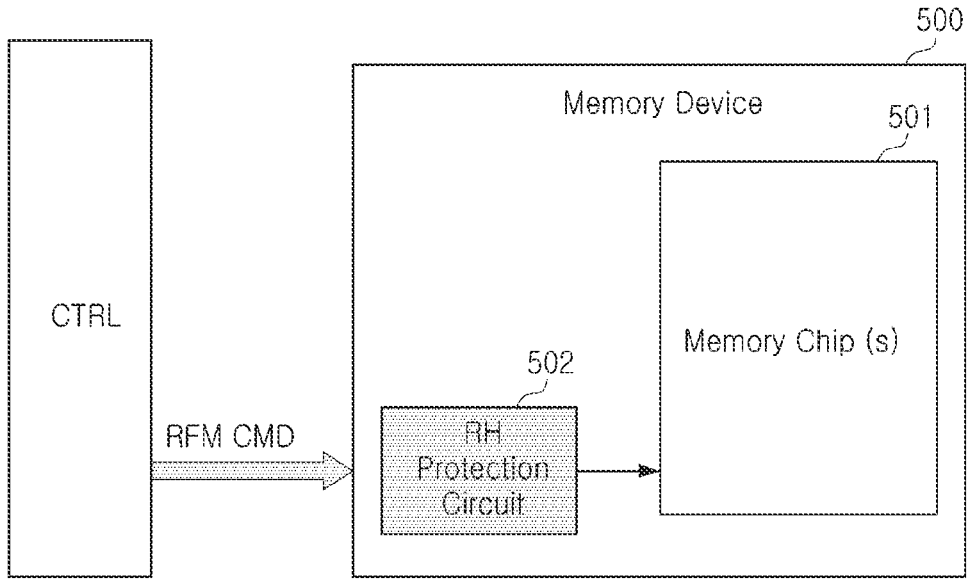
FIG. 8 is a diagram illustrating a memory device according to some example embodiments of the present inventive concepts.

FIG. 8 is a diagram illustrating a memory device 500 according to some embodiments of the present inventive concepts. Referring to FIG. 8, the memory device 500 may include at least one memory chip 501 and a row hammer protection circuit 502 configured to protect the memory chip 501 from a row hammer. The row hammer protection circuit 502 may perform a row hammer protection operation to manage the row hammer to be below a reference value as described above with reference to FIGS. 1 to 7 in response to a command (e.g., RFM CMD) received from the controller CTRL.

Meanwhile, the memory device according to some embodiments of the present inventive concepts may monitor the row hammer in real time and may output a warning signal according to a monitoring result.

Meanwhile, a memory device according to some embodiments of the present inventive concept may operate in association with a refresh management command.

Figure 9:
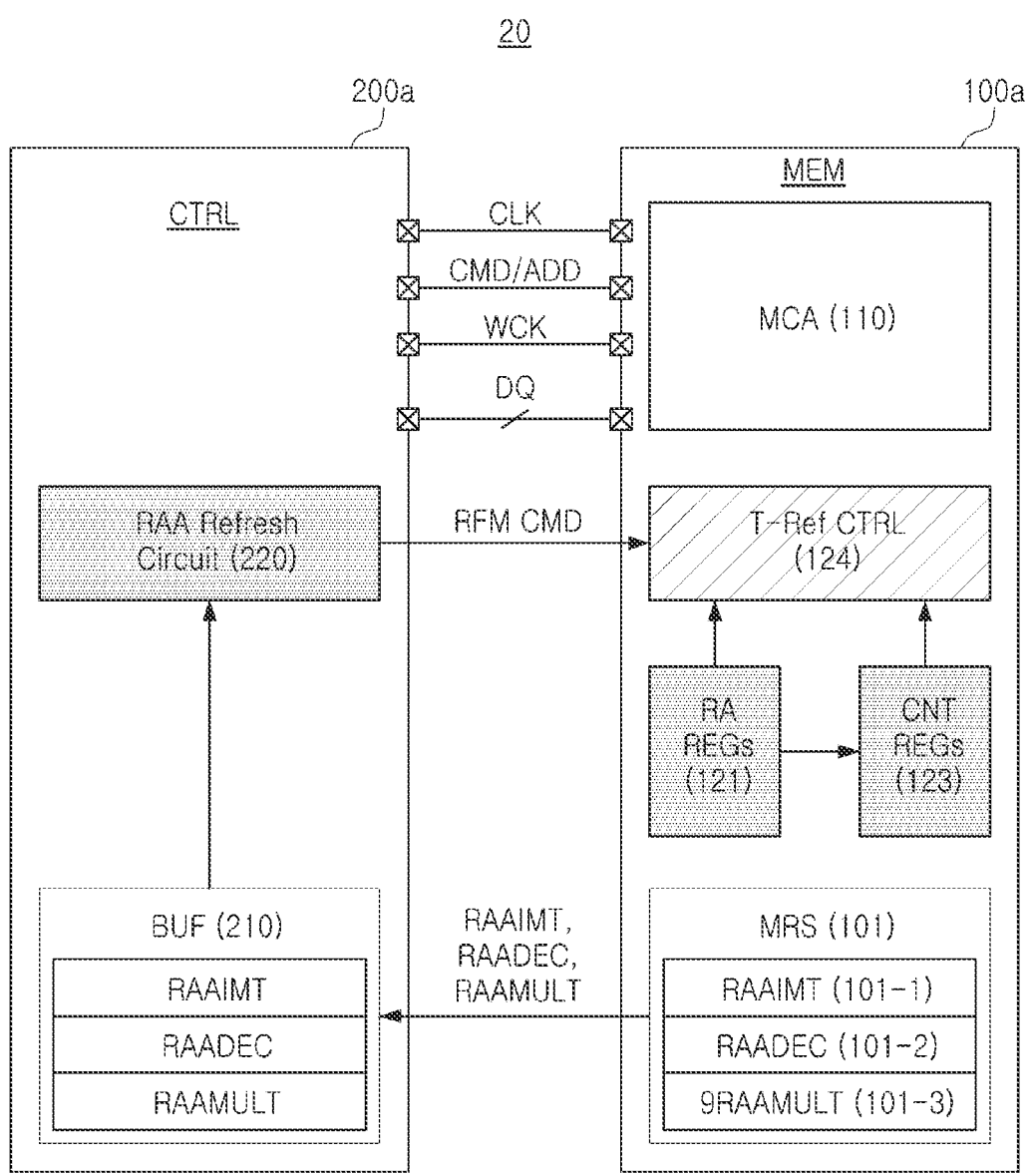
FIG. 9 is a diagram illustrating a memory system according to some example embodiments of the present inventive concepts.

FIG. 9 is a diagram illustrating a memory system according to some example embodiments of the present inventive concept. Referring to FIG. 9, a memory system 20 may include a memory device 100a and a memory controller 200a.

The memory device 100a may include a mode register circuit 101 (MRS), a memory cell array (MCA) 110, row address registers 121, count registers 123, and a target row refresh controller 124.

The mode register circuit 121 may include a plurality of mode registers storing or configured to store values for setting an operation mode. In particular, the mode register circuit 121 may include a first mode register 101-1, a second mode register 101-2, and a third mode register 101-3 for performing a refresh operation on a target row.

The first mode register 101-1 may store a reference value (RAAIMT, a first value) for comparing a rolling accumulated ACT (RAA) value. Here, the RAA value may refer to the actual number of ACTs measured by the system (controller) for a target row. That is, RAAIMT may be a threshold value for issuing a refresh management mode (RFM) command. For example, the controller 200a may issue the RFM command when the RAA value for the target row is greater than RAAIMT. The second mode register 101-2 may store a minimum value (RAADEC, a second value) for decreasing the stored RAA value after issuing the RFM command. RAADEC may be a minimum unit value of the RAA value reduced when the RFM command is issued once. In some embodiments, the RAA value may be reduced by RAAIMT×RAADEC after issuing the RFM command. The third mode register 101-3 may store a value (RAAMULT, a third value) used in determining the maximum value RAAMMT of the RAA value. RAAMULT is a parameter determining how many times RAADEC is reduced when the REF command is issued once. Here, the maximum value RAAMMT of the RAA value may be RAAIMT×RAAMULT. In some embodiments, RAAIMT, RAADEC, and RAAMULT may be determined by training during an initialization operation of the memory device 100a. In some embodiments, RAAIMT, RAADEC, and RAAMULT may be updated in real time in response to the RFM command. For example, RAAIMT, RAADEC, and RAAMULT may be determined according to a risk level.

The target row refresh controller 124 may be implemented (e.g., configured) to perform a target row refresh operation in response to the RFM command. Here, the target row refresh operation may be performed to manage the row hammer below the reference value as described above with reference to FIGS. 1 to 8.

The memory controller 200a may transmit a refresh command by referring to a warning signal provided from the memory device 100a. For example, when the warning signal output from the memory device 100a is activated, the memory controller 200a may transmit an auto refresh command to the memory device 100a by control signals (e.g., /RAS, /CAS, /WE). Also, as illustrated in FIG. 9, the memory controller 200a may issue the RFM command according to the RAA value. The memory controller 200a may include a RAA refresh circuit 220 and a buffer memory 210.

The RAA refresh circuit 220 may be implemented (e.g., configured) to store and manage RAA values for a plurality of target rows. The RAA refresh circuit 220 may issue the RFM command according to the RAA value using RAAIMT, RAADEC, and RAAMULT for the target rows. Here, the RFM command may include a specific bit (RU bit) instructing to change the stored values (RAAIMT, RAADEC, and RAAMULT) of a mode register circuit 121 of the memory device 100a. The buffer memory 210 BUF may receive and store the RAAIMT, RAADEC, and RAAMULT from the memory device 100a.

Figure 10:
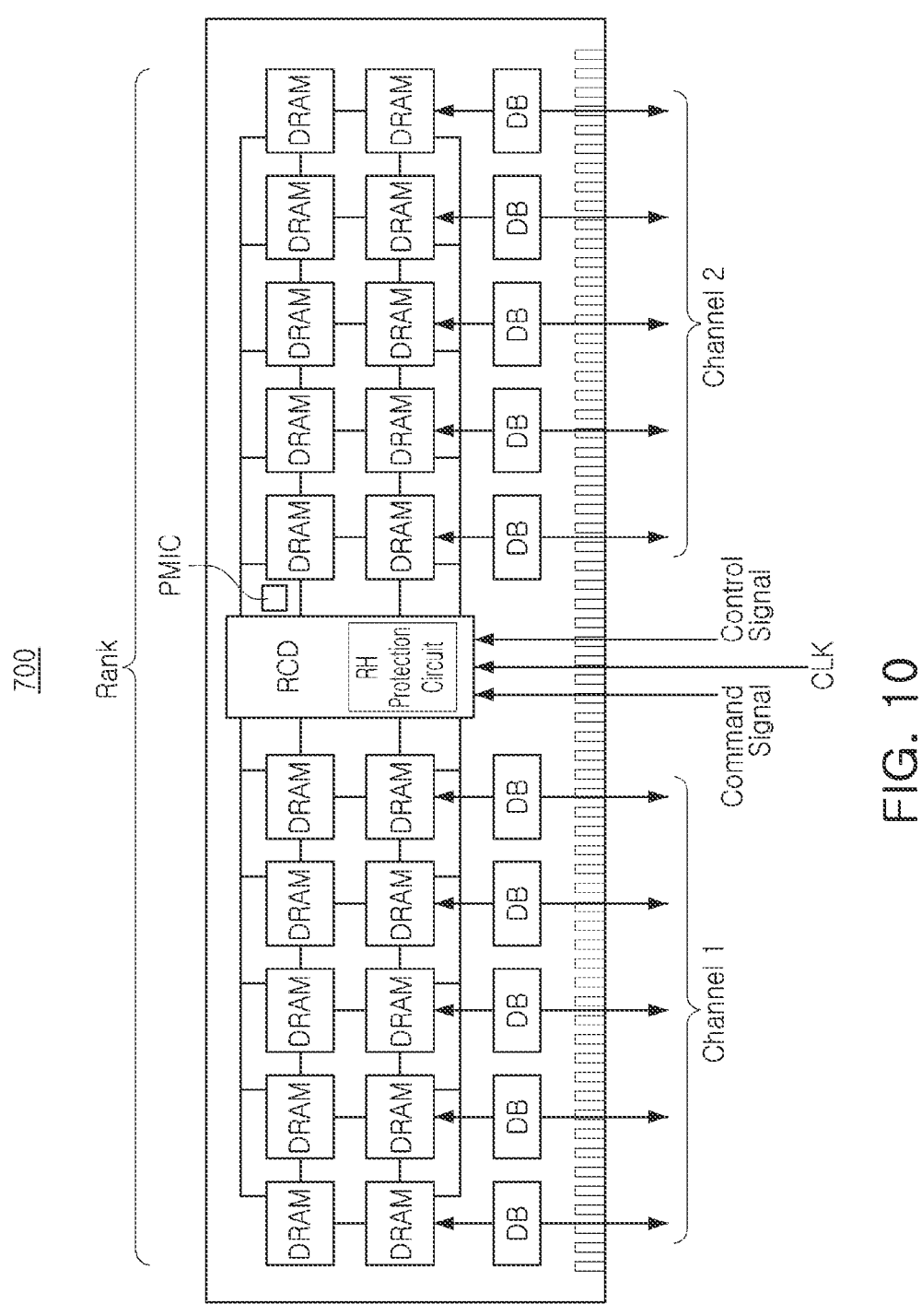
FIG. 10 is a diagram illustrating a memory module according to some example embodiments of the present inventive concepts.

The present inventive concept may be applicable to memory modules. FIG. 10 is a diagram illustrating a memory module 700 according to some embodiments of the present inventive concepts. Referring to FIG. 10, the memory module 700 may include a plurality of memory chips DRAM each including a memory cell array, a buffer chip RCD routing transmit/receive signals to/from a memory controller or managing memory operations for the memory chips, and a power management chip PMIC. As described above with reference to FIGS. 1 to 9, each of the plurality of memory chips may perform a refresh operation to manage row hammers below a reference value regarding various attack patterns.

The RCD may control the memory chips (DRAM) and the power management chip PMIC under the control of the memory controller. For example, the RCD may receive a command signal, a control signal and a clock signal from the memory controller. In some embodiments, the RCD may separately include a row hammer protection circuit. The memory chips DRAM may be connected to corresponding data buffers among the data buffers DB through corresponding data transmission lines to exchange data signals DQ and data strobe signals DQS.

The memory chips DRAM may be connected to the data buffer DB through corresponding data transmission lines to transmit and receive parity data PRT and data strobe signal DQS. A serial presence detect (SPD) chip may be a programmable read only memory (EEPROM). The SPD chip may include initial information or device information of the memory module 700. For example, the SPD chip may include initial information or device information, such as a module type, module configuration, storage capacity, module type, and execution environment of the memory module 700. When a memory system including the memory module 700 is initialized or booted, the memory controller may read device information from the SPD chip and recognize the memory module based on the read device information. In some embodiments, a rank may include 8 bank groups. Each of the bank groups may include 4 banks. In some embodiments, the memory chips may be divided into memory chips dedicated to a first channel and memory chips dedicated to a second channel.

The memory controller may transmit a command to each channel of the memory chip (DRAM). Each channel may have an independent command, address, and bus, such that the channels may operate in parallel with each other. One channel may have one or more ranks, and each rank may have an independent DRAM device. Also, all ranks within a channel may perform operations in parallel. Each rank may have a plurality of banks, and within the banks, DRAM cells exist in a two-dimensional array. Each bank may operate in parallel.

Figure 11:
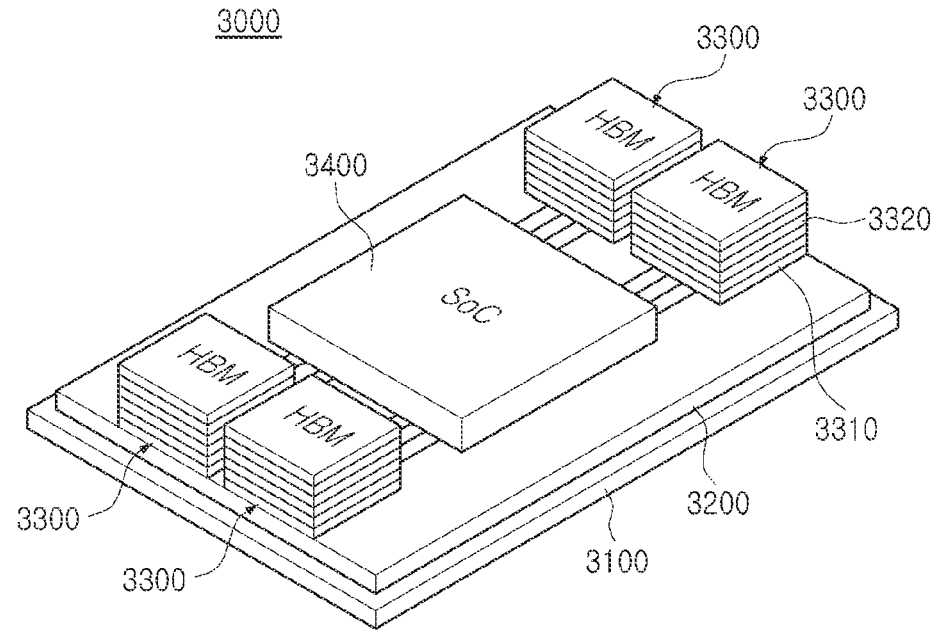
FIG. 11 is a diagram illustrating a semiconductor package including stacked semiconductor chips according to some example embodiments of the present inventive concepts.

FIG. 11 is a diagram illustrating a semiconductor package including stacked semiconductor chips according to some embodiments of the present inventive concepts. Referring to FIG. 11, a semiconductor package 3000 may be a memory module including at least one stacked semiconductor chip 3300 and a system-on-chip (SOC) 3400 mounted on a package substrate 3100, such as a printed circuit board. An interposer 3200 may be selectively further provided on the package substrate 3100. The stacked semiconductor chip 3300 may be formed of CoC (Chip-on-Chip).

The stacked semiconductor chip 3300 may include at least one memory chip 3320 stacked on a buffer chip 3310, such as a logic chip. As described above with reference to FIGS. 1 to 10, the memory chip 3320 may include a row hammer protection circuit managing a row hammer below a reference value for a target row address.

The buffer chip 3310 and at least one memory chip 3320 may be connected to each other by a through-silicon vias (TSV). The buffer chip 3320 may perform a training operation on the memory chip 3320. The stacked semiconductor chip 3300 may be, for example, 500 GB/sec to 1 TB/sec or higher bandwidth memory (HBM).

A memory device according to some embodiments of the present inventive concepts may include a row address register (component A), a count register (component B) configured to generate a threshold flag when a specific threshold value is exceeded, and an F-refresh controller (component C). The memory device of the present inventive concept may be implemented as a control device storing ACT RA and CNT in a register through the components A, B, and C, refreshing an adjacent RA of the ACT RA in the register only when CNT is equal to or higher than a specific threshold, and randomly selecting an RA, among applied ACT RAs, and refresh-protecting the corresponding RA and the adjacent RA when the CNT is less than the specific threshold.

In some embodiments, the component A may include a control device configured to receive the ACT signal, store an RA by applying a space saving algorithm, and generate a counting up signal. In some embodiments, the component B may include a control device configured to receive outputs from the components A and C, store/reset the CNT of RA, and generate a flag signal when the CNT exceeds a threshold. In some embodiments, the component C may include a control device configured to protect REG CNT Max RA or ACT Random RA by combining CMD, ACT, CNT, and Flag against a row hammer.

Meanwhile, the present inventive concepts may perform selectively one of a MAX Care refresh operation and a Random Care refresh operation according to a predetermined criterion. Here, the MAX Care refresh operation may be applied only to a pre-stored target row addresses. However, it should be understood that the present inventive concepts are not limited thereto. The MAX Card refresh operation of the present inventive concepts may be performed based on the access count of all word lines.

The memory device, the memory system including the same, and the operating method thereof according to some embodiments of the present inventive concept may manage row hammers to be a value equal to or less than a reference value.

The memory device, the memory system including the same, and the operating method thereof according to some embodiments of the present inventive concepts may prevent (e.g., may effectively prevent) a row hammer attack through a combination of an access count operation and a random pick operation.

While some example embodiments have been illustrated and described above, it will be apparent to those skilled in the art that modifications and variations could be made without departing from the scope of the present inventive concepts as defined by the appended claims.

What is claimed is:

1. A memory device comprising:

first registers configured to store row addresses;

second registers, each configured to store an access count of a corresponding one of the row addresses stored in the first registers and to activate a reference value flag signal when the access count is higher than a reference value; and a target row refresh controller configured to select one of the row addresses as a first target row address in response to the activated reference value flag signal, to perform a first refresh operation on at least one first row address adjacent to the first target row address, to randomly select one of the row addresses as a second target row address, and to perform a second refresh operation on at least one second row address adjacent to the second target row address, wherein the target row refresh controller is configured to perform the second refresh operation when the reference value flag signal indicates that the access count corresponding to the first target row address is not greater than the reference value.

2. The memory device of claim 1, further comprising a counter configured to receive an active command and a row address, to perform a count-up operation when the received row address is any one of the row addresses stored in the first registers, and to store an access count according to the count-up operation in a second register corresponding to the received row address.

3. The memory device of claim 1, wherein, after the first refresh operation or the second refresh operation is performed, the memory device is configured to reset an access count stored in the second register corresponding to the first target row address or the second target row address.

4. The memory device of claim 1, wherein the reference value is set in each of the second registers.

5. The memory device of claim 1, wherein:

the reference value is set to a value among a set of reference values by a plurality of test mode register sets, and each of the second registers is configured to activate the reference value flag signal by performing a Boolean OR operation on output values indicating whether any one of the of the access counts is greater than the reference value.

6. The memory device of claim 1, wherein the target row refresh controller is configured to receive access counts from the second registers and select a row address corresponding to a largest value among the access counts as the first target row address in response to the reference value flag signal.

7. The memory device of claim 1, wherein the target row refresh controller is configured to manage a row hammer attack for each of the row addresses stored in the first registers.

8. The memory device of claim 1, wherein the target row refresh controller is configured to perform in response to a refresh management command.

9. The memory device of claim 1, wherein the target row refresh controller is configured to select one of the row addresses as the second target row address by performing a random pick operation, and the random pick operation uses a random number generated by a random number generator.

10. The memory device of claim 1, wherein the first refresh operation and the second refresh operation are performed at a non-fixed ratio.

11. A memory system comprising:

a memory device; and a controller configured to control the memory device, wherein the memory device includes:

a memory cell array including a plurality of banks, each having memory cells connected to a plurality of word lines and a plurality of bit lines; and a target row refresh circuit configured to manage a row hammer attack of the memory cell array such that an access count corresponding to a row address register is maintained below a reference value.

12. The memory system of claim 11, wherein the target row refresh circuit includes:

first registers configured to store row addresses;

second registers each configured to store an access count corresponding to a respective row address of the row addresses and to generate a reference value flag signal when the access count is higher than a reference value; and a target row refresh controller configured to select one of the row addresses input via an active command through a random pick operation and to select the largest value among the access counts stored in the second registers.

13. The memory system of claim 12, wherein, when the reference value flag signal indicates that the access count is greater than the reference value, the target row refresh controller is configured to perform a refresh operation on a row address adjacent to a row address corresponding to the largest access count.

14. The memory system of claim 12, wherein, when the reference value flag signal indicates that the access count corresponding to the selected row address is not greater than the reference value, the target row refresh controller is configured to perform a refresh operation on a row address adjacent to a row address selected according to the random pick operation.

15. The memory system of claim 12, wherein the target row refresh controller is configured to reset an access count of a corresponding second register after performing a refresh operation.

16. An operating method of a memory device, the operating method comprising:

receiving a row address from an external device;

updating an access count when the row address is one of a plurality of previously stored target row addresses;

determining whether the updated access count is higher than a reference value;

selecting a target row address corresponding to an access count having a largest value among access counts of target row addresses when the updated access count is greater than the reference value; and performing a refresh operation on at least one row address adjacent to the selected target row address.

17. The operating method of claim 16, further comprising selecting one of the target row addresses through a random pick operation when the updated access count is not greater than the reference value.

18. The operating method of claim 16, further comprising activating a reference value flag signal when the updated access count is greater than the reference value.

19. The operating method of claim 16, further comprising:

receiving a refresh management command from the external device; and performing the refresh operation in response to the refresh management command.

20. The operating method of claim 16, further comprising resetting the access count of the selected target row address after performing the refresh operation.

* * * * *